(12) United States Patent
Wotzak

(10) Patent No.: US 7,258,746 B1
(45) Date of Patent: Aug. 21, 2007

(54) COATING APPARATUS FOR SEGMENTS OF CYLINDRICAL SUBSTRATES

(75) Inventor: Mark G. Wotzak, Watervliet, NY (US)

(73) Assignee: U.S. Government as represented by the Secretary of the Army, Washington, DC (US)

( * ) Notice: Subject to any disclaimer, the term of this patent is extended or adjusted under 35 U.S.C. 154(b) by 399 days.

(21) Appl. No.: 10/907,217

(22) Filed: Mar. 24, 2005

(51) Int. Cl.
*C23C 14/56* (2006.01)
*C23C 16/54* (2006.01)

(52) U.S. Cl. ............... 118/50; 118/715; 118/DIG. 10; 427/181; 427/238; 427/294

(58) Field of Classification Search .............. 118/50, 118/715, 317, 408, DIG. 10; 427/476, 181, 427/238, 294; 42/76.1; 89/14.8
See application file for complete search history.

(56) References Cited

U.S. PATENT DOCUMENTS 3,915,118 A * 10/1975 Koch et al. ............... 118/726
5,521,351 A * 5/1996 Mahoney ............... 219/121.59
6,926,923 B2 * 8/2005 Nakashima et al. ........ 427/233

* cited by examiner

Primary Examiner—Laura Edwards
(74) Attorney, Agent, or Firm—John F. Moran

(57) ABSTRACT

A coating apparatus includes a cylindrical holding chamber having open ends, an opening formed in an inner surface and an inner diameter; a specimen having a curved inner surface with a radius of curvature that is equal to one half the inner diameter of the cylindrical holding chamber, the specimen having a size such that, when inserted in the opening in the inner surface of the cylindrical holding chamber, the inner surface of the cylindrical holding chamber and the curved inner surface of the specimen form a continuous surface; a counter bore formed radially outward from the opening in the inner wall of the cylindrical holding chamber; at least one evacuation hole extending from an interior of the cylindrical holding chamber through a wall of the cylindrical holding chamber to the counter bore; a flat formed on an exterior surface of the cylindrical holding chamber around the counter bore; and fastener holes formed around the counter bore and extending from the flat into the wall of the cylindrical holding chamber.

9 Claims, 1 Drawing Sheet

COATING APPARATUS FOR SEGMENTS OF CYLINDRICAL SUBSTRATES

STATEMENT OF GOVERNMENT INTEREST

The inventions described herein may be manufactured, used and licensed by or for the U.S. Government for U.S. Government purposes.

BACKGROUND OF THE INVENTION

The invention relates in general to apparatus for coating segments of cylindrical substrates and in particular to apparatus for coating segments of cylindrical substrates, such as artillery cannon, using deposition processes that require vacuum.

Large caliber artillery cannon life can be extended by coating the interior of the cannon. Various types of coating methods and materials are used to coat the interior of a cannon. After a cannon interior is coated, the coating method and material is evaluated. Research into the best coating methods and materials is an ongoing effort. In the past, a short piece of gun tube, for example, about a foot long, was coated and then tested. The time required between depositions was about four days. Because the short piece of gun tube (substrate) was part of the vacuum system, the vacuum system had to be disassembled every time a new substrate (gun tube) was coated. The present invention reduces the time between depositions from about four days to about four hours.

SUMMARY OF THE INVENTION

One object of the invention is to provide an apparatus for coating segments of cylindrical substrates for deposition processes requiring vacuum.

Another object of the invention is to provide an apparatus that replaces an entire cylindrical substrate with a holder that accepts small segments of cylindrical substrate.

In the present invention, the inside diameter of the holding chamber is the same as the inside diameter of the cylindrical substrate that is being mimicked. The invention significantly reduces the time between depositions, which in turn allows for more depositions to occur in a given period of time. The access to the inside of the holding cylinder provides opportunity to attach gauges and monitoring devices to determine the behavior of the coating process. A segment of a cylindrical substrate is, of course, more manageable than the entire cylinder. The segment requires less machining, material, and manpower during testing. The invention is less likely to have a vacuum leak due to the decrease in the number of seals broken and reapplied.

Multiple ports can be machined into the cylindrical holding chamber to hold specimens that are prepared differently (for example, different surface finishes), but are coated with exactly the same process parameters. Additionally, the apparatus can be used to coat curved objects that become final products, rather than test specimens.

A purpose of the invention is to provide an apparatus for coating segments of cylindrical substrates using deposition processes that require vacuum. The apparatus substitutes a segment of a cylindrical substrate for an actual cylindrical substrate work piece such as a length of a large caliber cannon. The apparatus eliminates the need to use a complete cylindrical substrate work piece to produce multiple coatings. The invention is particularly useful for determining process parameters prior to applying a coating to a complete cylindrical substrate.

The reduction of time between depositions permits more parameters to be tested during a given period. A segment of a cylindrical substrate may be more manageable in terms of substrate preparation and coating characterization due to its relative size. Preferably, a segment of a cylindrical substrate can be loaded into the process chamber via a load lock device to avoid exposure to atmospheric pressure. Implementing a load lock is not necessary, but it eliminates the need to precondition the target to remove oxides and contaminants and reduces the time for pumping the system down to the desired vacuum level. The presence of a void on the side of a cylindrical substrate provides the opportunity to attach gauges and monitoring devices (such as, but not limited to, pressure manometer, plasma probe, residual gas analyzer) in an area that would normally be inaccessible when coating a complete cylindrical substrate.

The invention will be better understood, and further objects, features, and advantages thereof will become more apparent from the following description of the preferred embodiments, taken in conjunction with the accompanying drawings.

BRIEF DESCRIPTION OF THE DRAWINGS

In the drawings, which are not necessarily to scale, like or corresponding parts are denoted by like or corresponding reference numerals.

DETAILED DESCRIPTION OF THE PREFERRED EMBODIMENTS

Figure 1:
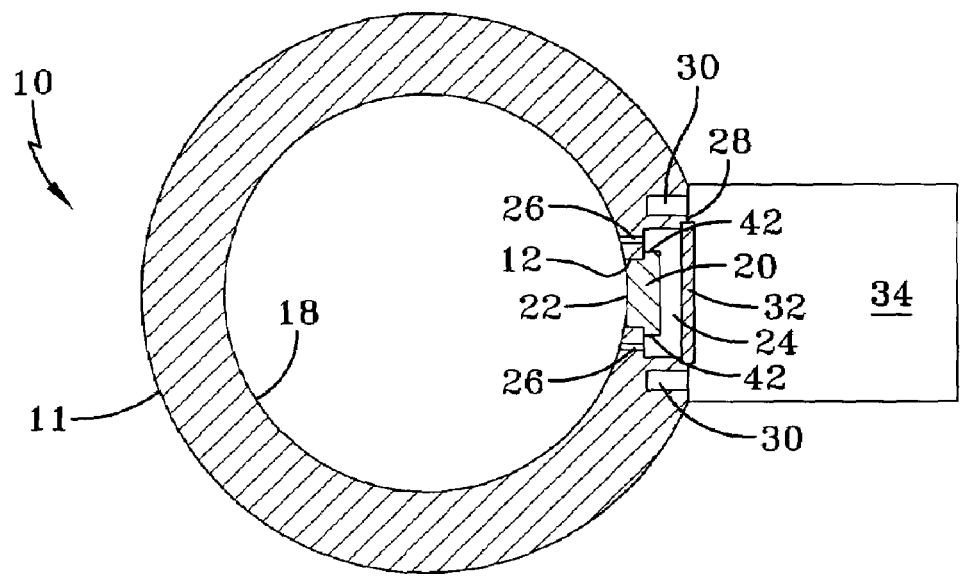
FIG. 1 is a top section schematic drawing of one embodiment of the invention.
Figure 2:
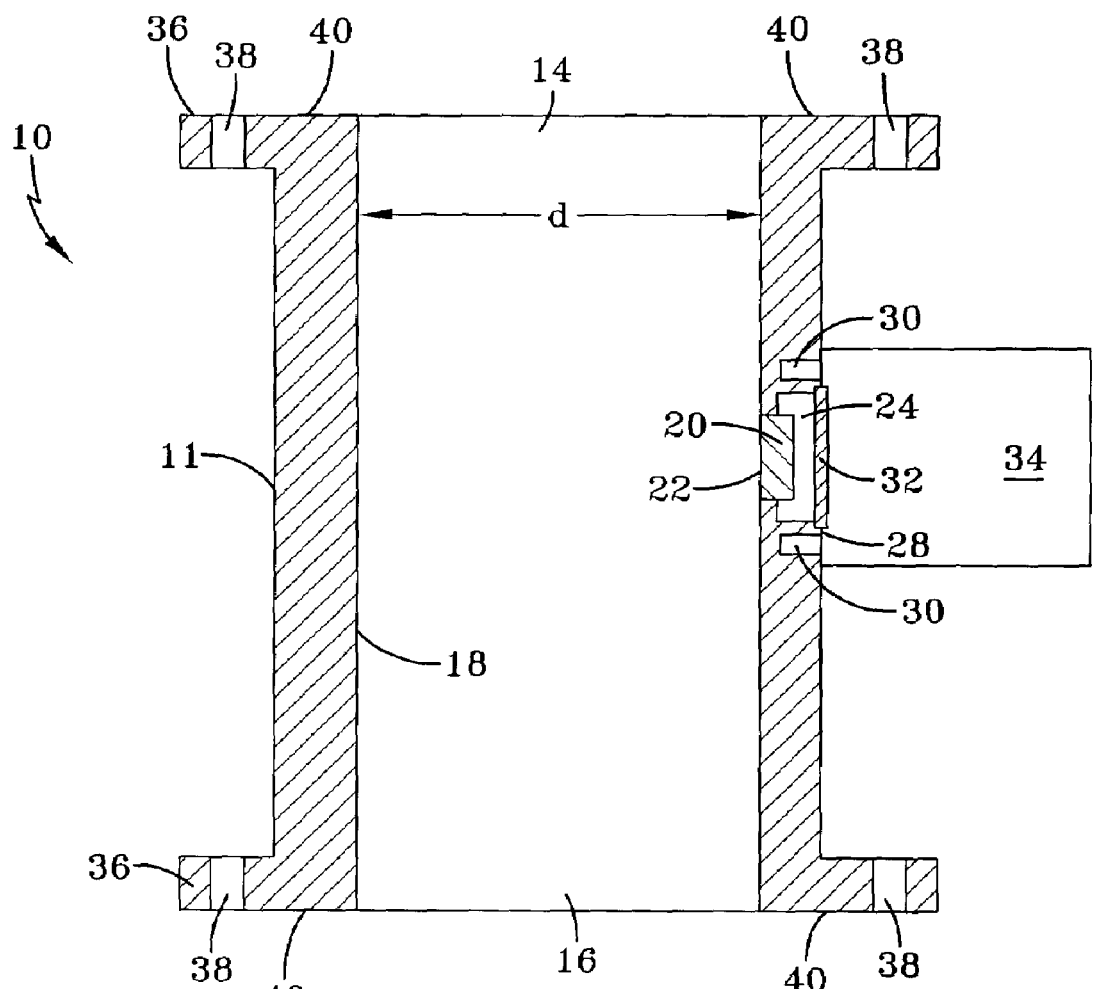
FIG. 2 is a side section schematic drawing of the embodiment of FIG. 1.

FIG. 1 is a top section schematic drawing of one embodiment of a coating apparatus 10 according to the invention. FIG. 2 is a side section schematic drawing of the embodiment of FIG. 1. Coating apparatus 10 includes a cylindrical holding chamber 11 having open ends 14, 16 and an inner diameter d. An opening 12 is formed in the inner surface 18. The open ends 14, 16 of the chamber 11 are provided with flanges 36 the surface of which provide a vacuum seal surface 40. Flanges 36 includes holes 38 for attachment to another flange.

A specimen 20 has a curved inner surface 22 with a radius of curvature that is equal to one half the inner diameter d of the cylindrical holding chamber 11. That is, the curvature of the specimen inner surface 22 and the curvature of the inner surface 18 of the chamber 11 are the same. The specimen 20 is sized so that when it is inserted in the opening 12, the inner surface 18 of the chamber 11 and the curved inner surface 22 of the specimen form a continuous surface. Rails 42 are located on the edges of the specimen 20 to properly position the specimen and prevent it from falling in the chamber 11.

A counter bore 24 is formed radially outward from the opening 12 in the inner wall of the cylindrical holding chamber. At least one evacuation hole 26 extends from the interior of the chamber 11 through the wall of the chamber 11 to the counter bore 24. In the embodiment shown in FIGS. 1 and 2, two evacuation holes 26 are shown. A flat 28 is formed on the exterior surface of the chamber 11 around the counter bore 24. Fastener holes 30 are formed around the counter bore 24 and extend from the flat 28 into the wall of the chamber 11. A vacuum seal 32 is placed around the counter bore 24. The type of vacuum seal 32 is dependent upon the level of vacuum required for the coating process. A vacuum component 34, such as a load lock device, is fixed to the flat 28 using fasteners and the fastener holes 30. The number of fasteners is dependent on the vacuum seal type and size.

More than one specimen 20 may be coated simultaneously by providing additional openings 12 in the holder 11. Each opening 12 includes a corresponding counter bore 24, one or more evacuation holes 26, a flat 28, fastener holes 30, a vacuum seal 32 and a vacuum component 34.

Industrial uses other than artillery development may benefit from the invention. Some other uses include optics, for example, reflective and anti-reflective coatings; automotive industry, for example, cylinder bores; chemical industry, for example, corrosion resistant coatings and catalytic coatings; food processing; pressure vessels; and the coating of curved objects wherein the curved object is the final product.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. An apparatus for coating a specimen, comprising:
   a cylindrical holding chamber for coating, said chamber having open ends, an opening formed in an inner surface and an inner diameter;
   a specimen having a curved inner surface with a radius of curvature that is equal to one half the inner diameter of the cylindrical holding chamber, the specimen having a size such that, when inserted in the opening in the inner surface of the cylindrical holding chamber, the inner surface of the cylindrical holding chamber and the curved inner surface of the specimen form a continuous surface;
   a counter bore formed radially outward from the opening in the inner surface of the cylindrical holding chamber;
   at least one evacuation hole extending from an interior of the cylindrical holding chamber through a wall of the cylindrical holding chamber to the counter bore;
   a flat formed on an exterior surface of the cylindrical holding chamber around the counter bore;
   fastener holes formed around the counter bore and extending from the flat into the wall of the cylindrical holding chamber;
   a vacuum seal placed around the counter bore; and
   a vacuum component fixed to the flat.

2. The apparatus of claim 1 wherein the vacuum component comprises a load lock device.

3. The apparatus of claim 1 wherein the specimen includes rails formed on its edges.

4. The apparatus of claim 1 further comprising flanges attached to the open ends of the cylindrical holding chamber.

5. The apparatus of claim 1 wherein the at least one evacuation hole extending from an interior of the cylindrical holding chamber through a wall of the cylindrical holding chamber to the counter bore comprises a plurality of such holes.

6. An apparatus for coating a specimen having a curved inner surface with a radius of curvature, rails along its edges and a size, the apparatus comprising:
   a cylindrical holding chamber for coating, said chamber having open ends, an opening formed in an inner surface and an inner diameter that is equal to twice the radius of curvature of the specimen;
   the opening in the inner surface being of a size such that, when the specimen is inserted in the opening, the inner surface of the cylindrical holding chamber and the curved inner surface of the specimen form a continuous surface;
   a counter bore formed radially outward from the opening in the inner surface of the cylindrical holding chamber;
   at least one evacuation hole extending from an interior of the cylindrical holding chamber through a wall of the cylindrical holding chamber to the counter bore;
   a flat formed on an exterior surface of the cylindrical holding chamber around the counter bore;
   fastener holes formed around the counter bore and extending from the flat into the wall of the cylindrical holding chamber;
   a vacuum seal placed around the counter bore; and
   a vacuum component fixed to the flat.

7. The apparatus of claim 6 wherein the vacuum component comprises a load lock device.

8. The apparatus of claim 6 further comprising flanges attached to the open ends of the cylindrical holding chamber.

9. The apparatus of claim 6 wherein the at least one evacuation hole extending from an interior of the cylindrical holding chamber through a wall of the cylindrical holding chamber to the counter bore comprises a plurality of such holes.

* * * * *